(12) United States Patent
Knoedgen

(10) Patent No.: US 6,552,579 B1
(45) Date of Patent: Apr. 22, 2003

(54) FUEL GAUGE POWER SWITCH WITH CURRENT SENSE

(75) Inventor: Horst Knoedgen, Munich (DE)

(73) Assignee: Dialog Semiconductor GmbH, Kirchheim/Teck.-Nabern (DE)

(*) Notice: Subject to any disclaimer, the term of this patent is extended or adjusted under 35 U.S.C. 154(b) by 0 days.

(21) Appl. No.: 10/126,384

(22) Filed: Apr. 19, 2002

(30) Foreign Application Priority Data

Apr. 2, 2002 (EP) .............................. 02392001

(51) Int. Cl.⁷ .............................................. G01R 19/00
(52) U.S. Cl. .......................................... 327/51; 327/101
(58) Field of Search ........................ 327/50, 51, 77–78, 327/538, 543, 101, 132, 134, 427; 323/277

(56) References Cited

U.S. PATENT DOCUMENTS

| | | | | |
|---|---|---|---|---|
| 4,553,084 A | * | 11/1985 | Wrathall | 323/316 |
| 5,680,034 A | | 10/1997 | Redl | 323/21 |
| 5,815,027 A | * | 9/1998 | Tihanyi et al. | 327/543 |
| 5,821,740 A | | 10/1998 | Hodgins et al. | 323/277 |
| 5,986,441 A | * | 11/1999 | Koroncai et al. | 323/277 |
| 6,201,417 B1 | | 3/2001 | Blum et al. | 327/14 |

* cited by examiner

Primary Examiner—Terry D. Cunningham
Assistant Examiner—Long Nguyen
(74) Attorney, Agent, or Firm—George O. Saile; Stephen B. Ackerman; Douglas R. Schnabel

(57) ABSTRACT

A new current sense circuit is achieved. The circuit comprises, first, an output transistor having gate, source, and drain. The drain is coupled to a load, the source is coupled to a power rail, the gate is coupled to a control voltage such that the output transistor conducts an output current. Second, a sense transistor has gate, source, and drain. The source is coupled to the power rail and the gate is coupled to the control voltage. A sensing factor comprises the output transistor size divided by the sense transistor size. Third, a means of equalizing the sense transistor drain-to-source voltage and the output transistor drain-to-source voltage is used such that the sense transistor drain current comprises the output current divided by the sensing factor. Finally, a current controlled oscillator is included. The current controlled oscillator has input and output. The input comprises the sense transistor drain current. The output comprises a cyclical signal having a frequency proportional to the output current.

20 Claims, 3 Drawing Sheets

FUEL GAUGE POWER SWITCH WITH CURRENT SENSE

BACKGROUND OF THE INVENTION (1) Field of the Invention

The invention relates to a current sense circuit for a power output, and more particularly, to a current sense circuit using a novel sensing current matching circuit and using a current controlled oscillator to generate a frequency proportional to the output current.

(2) Description of the Prior Art

Current sensing circuits find many applications. In power switching circuits, it is desirable to know the load current so that over-current protection can be performed. In addition, it is useful to know the load current in some applications, such as in fuel gauge circuits, where the current level must be controlled. It is further desirable to accurately determine the load current without the addition of sensing resistance in the load current path.

Several prior art inventions describe current sensing circuits. U.S. Pat. No. 5,821,740 to Hodgins et al describes a DC-to-DC converter using a sensing transistor in parallel with an output driver. A sense resistor is driven by the sensing transistor and is used to detect over-current conditions. U.S. Pat. No. 5,680,034 to Redl and U.S. Pat. No. 6,201,417 to Blum et al teach pulse width modulation (PWM) controllers using a current sense resistor and an S-R latch for current limiting.

SUMMARY OF THE INVENTION

A principal object of the present invention is to provide an effective and very manufacturable current sense circuit for a power switch output.

A further object of the present invention is to provide a current sense circuit where a sense current is generated using a sense transistor.

A yet further object of the present invention is to improve the accuracy of the sense current by equalizing the drain to source voltage for the power transistor and the sense transistor.

Another further object of the present invention is to provide a digital frequency signal in proportion to the power switch output current using a current controlled oscillator.

Another still further object of the present invention is to provide a current sense circuit with a high dynamic range and excellent linearity.

Another still further object of the present invention is to provide a sense circuit with an adjustable sense factor.

In accordance with the objects of this invention, a current sense circuit is achieved. The circuit comprises, first, an output transistor having gate, source, and drain. The drain is coupled to a load, the source is coupled to a power rail, and the gate is coupled to a control voltage such that the output transistor conducts an output current. Second, a sense transistor has gate, source, and drain. The source is coupled to the power rail, and the gate is coupled to the control voltage. A sensing factor comprises the output transistor size divided by the sense transistor size. Third, a means of equalizing the sense transistor drain-to-source voltage and the output transistor drain-to-source voltage is used such that the sense transistor drain current comprises the output current divided by the sensing factor. Finally, a current controlled oscillator is included. The current controlled oscillator has input and output. The input comprises the sense transistor drain current. The output comprises a cyclical signal having a frequency proportional to the output current.

BRIEF DESCRIPTION OF THE DRAWINGS

In the accompanying drawings forming a material part of this description, there is shown.

DESCRIPTION OF THE PREFERRED EMBODIMENTS

The preferred embodiments disclose a novel current sense circuit for a power switching output. The present invention teaches a current sense circuit using a current sensing FET, a circuit to equalize the drain-to-source voltages of the power switch FET and sensing FET, and a current controlled oscillator to convert the sensing current into a proportional frequency. It should be clear to those experienced in the art that the present invention can be applied and extended without deviating from the scope of the present invention.

Figure 1:
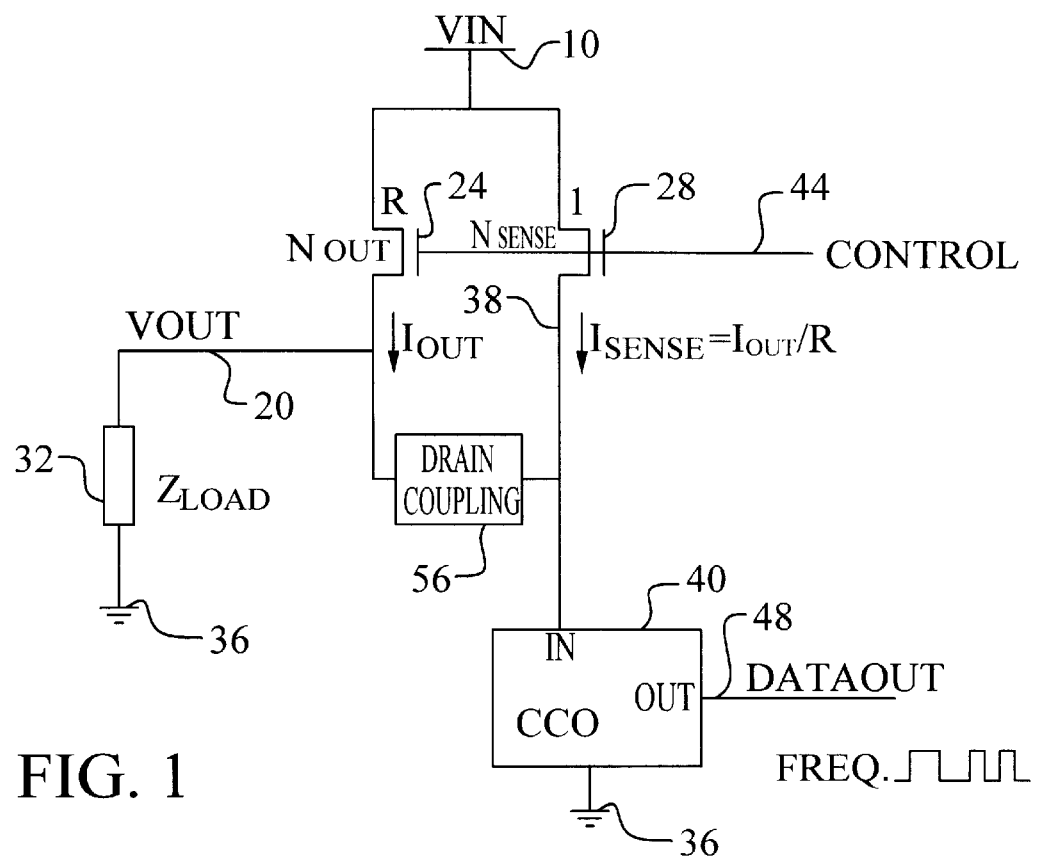
FIG. 1 illustrates the preferred embodiment of the present invention.

Referring now to FIG. 1, the preferred embodiment of the present invention is illustrated. Several important features of the invention are shown. The circuit comprises, first, an output transistor NOUT 24 having gate, source, and drain. The output transistor preferably comprises an NMOS FET device. Any FET device may be used, including a PMOS device. The output transistor NOUT drain is coupled to an external load $Z_{LOAD}$ 32 at the output node VOUT 20. The source of NOUT 24 is coupled to a power rail, in this case the VIN voltage supply 10. The gate of NOUT 24 is coupled to a control voltage CONTROL 44 such that NOUT conducts an output current when CONTROL is asserted to a voltage above the threshold of NOUT. In this arrangement, the output is a high side driver circuit where the CONTROL signal 44 must be substantially higher than the output voltage VOUT and may require a charge pump. Other biasing arrangements could be used. This is not a necessary feature of the present invention. Note that $Z_{LOAD}$ 32 may comprise a resistive load or an inductive load, such as a coil. In addition, this circuit may comprise a part of a DC-to-DC converter.

Figure 3:
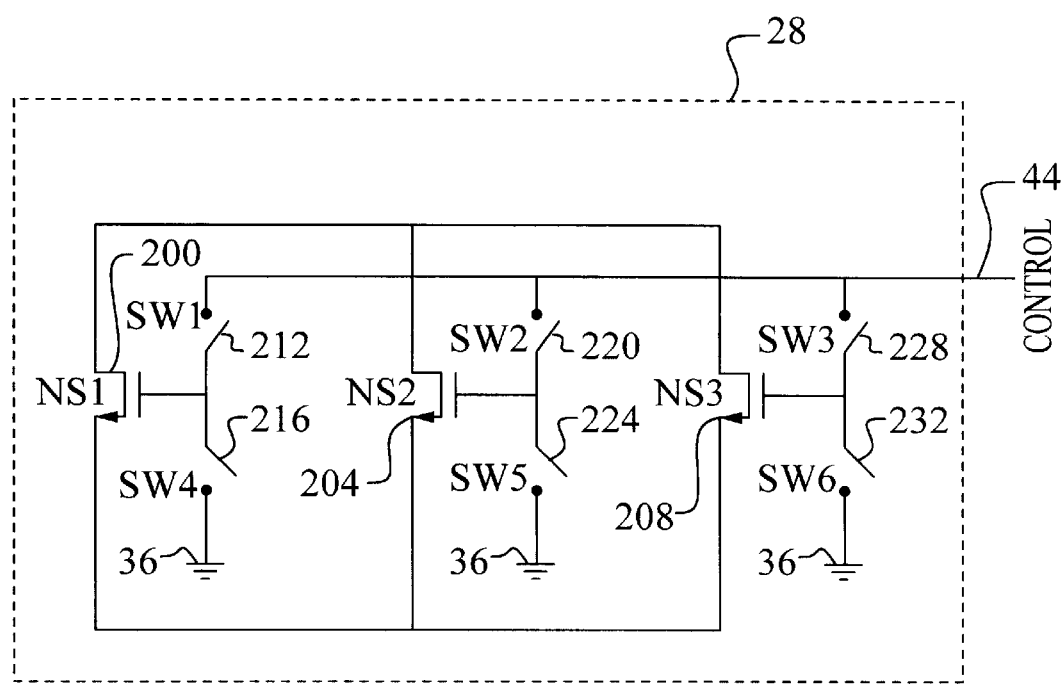
FIG. 3 illustrates a method for obtaining an adjustable sensing factor.

Second, a sense transistor NSENSE 28 has gate, source, and drain. The source of NSENSE is coupled to the power rail VIN 10, and the gate of NSENSE is coupled to the control voltage CONTROL 44. The sensing transistor NSENSE must comprise the same type of device as NOUT 24. If NOUT is a NMOS device, then NSENSE should be a NMOS device of the same process parameters. Note that the output transistor NOUT has a relative size of R while the sensing transistor has the relative size of 1 where R>1. For example, NOUT 24 may be a very large drive transistor having a width of about 500 kilomicrons and length of about 0.5 microns. The sensing transistor NSENSE 28 would be much smaller. For example, NSENSE may have a width of about 500 microns and length of about 0.5 microns. The sensing factor, R, comprises the output transistor size divided by the sense transistor size. In this example case, R equals 1000. In the preferred embodiment, the sensing factor R comprises a range of between about 1 and 10,000. In addition, as an optional feature, the sensing factor R may be made variable. A preferred means of creating a variable sensing factor R is shown in FIG. 3 and discussed below.

Figure 2:
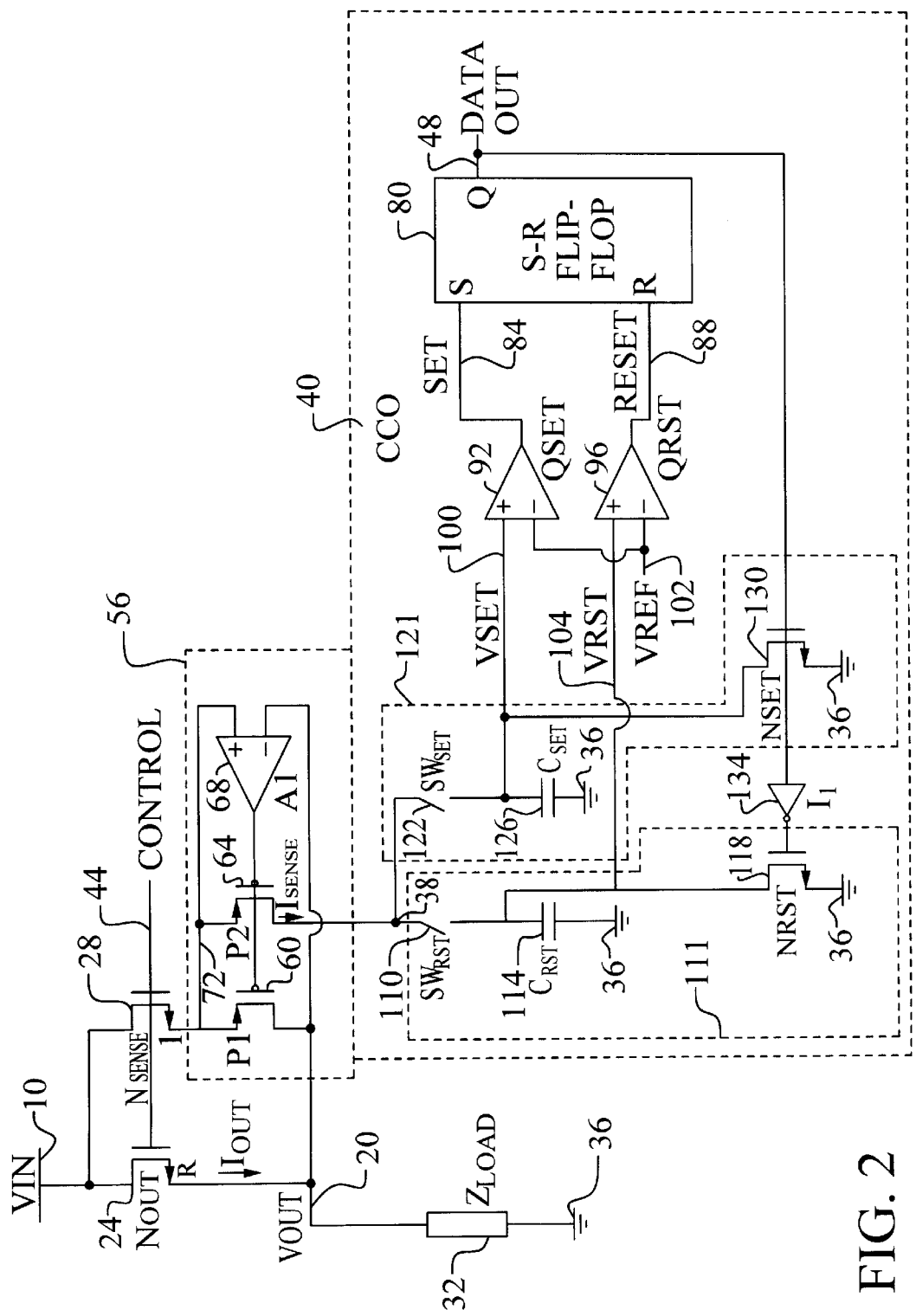
FIG. 2 illustrates a more detailed version of the preferred embodiment of the present invention.

Referring again to FIG. 1, a means of equalizing 56, or drain coupling 56, the sense transistor NSENSE 28 drain-to-source voltage and the output transistor NOUT 24 drain-to-source voltage is used such that the sense transistor NSENSE drain current $I_{SENSE}$ comprises the output current $I_{OUT}$ divided by the sensing factor R. A preferred implementation of the drain coupling 56 is shown in FIG. 2 and discussed below. Referring again to FIG. 1, a current controlled oscillator (CCO) 40 is included. The current controlled oscillator 40 has input 38 and output DATAOUT 48. The input to the CCO 40 comprises the sense transistor drain current $I_{SENSE}$. The output DATAOUT 48 comprises a cyclical signal having a frequency proportional to the output current. A preferred implementation of the CCO 40 is shown in FIG. 2 and discussed below.

Referring now to FIG. 2, a more detailed version of the preferred embodiment of the present invention is shown. Several important features of the present invention are illustrated. Where like features between FIGS. 1 and 2 are illustrated, the elements have been numbered the same. In FIG. 2, the means of equalizing 56 the drain voltages of NOUT 24 and NSENSE 28 is shown in detail. The means of equalizing circuit 56 is used to cause the operating conditions of NOUT 24 and NSENSE 28 to be nearly identical. More specifically, by design, the gate-to-source voltages of NOUT 24 and NSENSE 28 are the same. By causing the drain-to-source voltages to be equal, the drain current of the two devices should fit the equation given by $I_{SENSE}=I_{OUT}/R$.

The means of equalizing 56 the drain voltages of NOUT 24 and NSENSE 28 preferably comprises, first, a first transistor P1 60 having gate, drain, and source. The source of P1 60 is coupled to the drain of NSENSE 28. The drain of P1 60 is coupled to the drain of NOUT 28. Second, a second transistor P2 64 has gate, drain, and source. The source of P2 64 is coupled to the sense transistor NSENSE drain. The drain of P2 64 is coupled to the current controlled oscillator (CCO) 40 input. Both P1 60 and P2 64 preferably comprise PMOS devices.

An amplifier A1 68 having two inputs and an output completes the means of equalization 56. One input is coupled to the drain of NSENSE 28. The other input is coupled to the drain of NOUT 24. The output of A1 68 is coupled to the P1 60 and P2 64 gates. In this novel configuration, the circuit 56 forces the drain voltages of NOUT 24 and NSENSE 28 to nearly the same voltage while causing the sensing current $I_{SENSE}$ to flow into the CCO circuit 40.

The important details of the preferred embodiment of the current controlled oscillator circuit 40 are shown in FIG. 2. The circuit 40 preferably comprises, first, a S-R flip-flop 80. The S-R flip-flop 80 has set and reset inputs and an output. The S-R flip flop 80 output comprises the current controlled oscillator output DATAOUT 48. Second, a set comparitor QSET 92 has two inputs and an output. One QSET 92 input is coupled to a voltage reference VREF 102. The output of QSET 92 is coupled to the S-R flip-flop 80 SET input. Third, a reset comparitor QRST 96 has two inputs and an output. One QRST 96 input is coupled to the voltage reference. The QRST 96 output is coupled to the S-R flip-flop 80 RESET input.

Fourth, a set current-to-voltage converter 121 comprises the first switch $SW_{SET}$ 122, the capacitor $C_{SET}$ 126, and the second switch NSET 130. The set current-to-voltage converter 121 has an input 38 and an output VSET 100. The input to the set current-to-voltage converter 121 is the sense current $I_{SENSE}$. $I_{SENSE}$ is switchably coupled to the CCO 40 input by the first switch $SW_{SET}$ 122. When $SW_{SET}$ 122 is ON, $I_{SENSE}$ charges $C_{SET}$ 126 and the current is thereby converted to the voltage VSET 100. VSET 100 is coupled to the set comparitor QSET 92.

Finally, a reset current-to-voltage converter 111 comprises the first switch $SW_{RST}$ 110, the capacitor $C_{RST}$ 114, and the second switch NRST 118. The reset current-to-voltage converter 111 has an input 38 and an output VRST 104. The input to the set current-to-voltage converter 111 is also the sense current $I_{SENSE}$. $I_{SENSE}$ is switchably coupled to the CCO 40 input by the first switch $SW_{RST}$ 110. When $SW_{RST}$ 110 is ON, $I_{SENSE}$ charges $C_{RST}$ 114, and the current is thereby converted to the voltage VRST 104. VRST 104 is coupled to the reset comparitor QRST 96.

The CCO circuit 40 operates in either the set or reset mode. In the set mode, the S-R flip-flop 80 is set and the DATAOUT signal 48 is high. In this state, the set second switch NSET 130 is ON and the set first switch $SW_{SET}$ 122 is OFF. Therefore, the VSET 100 node is pulled to ground 36 through NSET 130. Meanwhile, because of the inverter I1 134, the reset second switch NRST 118 is OFF and the reset first switch $SW_{RST}$ 110 is ON. In this state, the sense current $I_{SENSE}$ charges $C_{RST}$ 114, and the current is thereby converted to the voltage VRST 104. When VRST 104 exceeds the voltage reference, VREF 102, reset comparitor QRST 96 switches high to assert the RESET 88 line of the S-R flip-flop 80. Since the SET line 84 is already driven low by NSET 130, the state of the S-R flip-flop 80 changes to RESET, and DATAOUT 48 is driven low.

During the RESET state, the reset current-to-voltage converter 111 is in the OFF state where NRST 118 is turned ON and $SW_{RST}$ 110 is turned OFF. $SW_{SET}$ 122 is turned ON and NSET 130 is turned OFF. Therefore, the sense current $I_{SENSE}$ charges the set capacitor $C_{SET}$ 126, and VSET 100 increases in voltage. When VSET 100 exceeds the value VREF 102, the set comparitor QSET 92 is toggled. The SET signal 84 is asserted. Since the RESET 88 is driven low by NRST 118, the S-R flip-flop 80 is now forced to the SET state again.

The S-R flip-flop 80 output DATAOUT 48 will cyclically toggle between high and low at a frequency that is directly proportional to the $I_{SENSE}$ current. The greater the value of $I_{SENSE}$, the faster the capacitors are charged and the faster DATAOUT 48 cycles. Smaller values of $I_{SENSE}$ reduce the cycle frequency. If the frequency is monitored, the energy of the power switch NOUT 24 can be monitored.

Significantly, the novel design includes only the voltage reference VREF 102 that must be calibrated. By calibrating VREF 102, through trimming a resistor value for instance, a correction can be made for process variation in the capacitor values. Further, by using this simple CCO circuit 40, the linearity of the circuit is extremely high. Only the temperature drift of the capacitors $C_{SET}$ 126 and $C_{RST}$ 114 is important. This drift is only 30 ppm, however. Therefore, the system is very stable over temperature.

As an additional feature, the sensing factor R can be adjusted to thereby adjust the dynamic range of the current. For example, for relatively small output currents $I_{OUT}$, it may be desirable to reduce the sensing factor R so that the sensing current, $I_{SENSE}$, remains large enough for good noise immunity and frequency output. Alternatively, it may be desirable to increase the sensing factor R when the output current $I_{OUT}$ is very large.

Referring now to FIG. 3, a simple, preferred means of providing a variable sensing factor is shown. The sensing transistor 28 is divided into a plurality of sensing transistors, NS1 200, NS2 204, and NS3 208. A series of switches SW1 212 through SW6 232 is used select which of any or which of a combination of the sensing devices are used. A circuit of this type could be used to create a range of sensing factors such that, for example, a dynamic range of output current from about 10 microamps to about 3 amps could be converted into proportional frequencies using the same circuit.

The present invention provides an effective and very manufacturable current sense circuit for a power switch output. The current sense circuit generates a sense current using a sense transistor. The accuracy of the sense current is improved by equalizing the drain to source voltage for the power transistor and the sense transistor. A cyclical output signal is generated having a frequency proportional to the power switch output current using a current controlled oscillator. The current sense circuit exhibits a high dynamic range and excellent linearity. Finally, the sense circuit may have an adjustable sensing factor.

As shown in the preferred embodiments, the novel current sense circuit for a power switch provides an effective and manufacturable alternative to the prior art.

While the invention has been particularly shown and described with reference to the preferred embodiments thereof, it will be understood by those skilled in the art that various changes in form and details may be made without departing from the spirit and scope of the invention.

What is claimed is:

1. A current sense circuit comprising:
   an output transistor having gate, source, and drain, wherein said drain is coupled to a load, wherein said source is coupled to a power rail, and wherein said gate is coupled to a control voltage such that said output transistor conducts an output current;
   a sense transistor having gate, source, and drain, wherein said source is coupled to said power rail, wherein said gate is coupled to said control voltage, and wherein a sensing factor is equal to said output transistor size divided by said sense transistor size;
   a means of equalizing said sense transistor drain-to-source voltage and said output transistor drain-to-source voltage such that said sense transistor drain current is equal to said output current divided by said sensing factor; and
   a current controlled oscillator having input and output wherein said input is said sense transistor drain current and said output comprises a cyclical signal having a frequency proportional to said output current.

2. The circuit according to claim 1 wherein said output transistor and said sense transistor comprise NMOS transistors.

3. The circuit according to claim 1 wherein said sensing factor value is in a range between about 1 and 10,000.

4. The circuit according to claim 1 wherein said sensing factor value is adjustable.

5. The circuit according to claim 1 wherein said means of equalizing comprises:
   a first transistor having gate, drain, and source, wherein said source is coupled to said sense transistor drain and wherein said drain is coupled to said output transistor drain;
   a second transistor having gate, drain, and source, wherein said source is coupled to said sense transistor drain and wherein said drain is coupled to said current controlled oscillator input; and
   an amplifier having two inputs and an output wherein one of said inputs is coupled to said sense transistor drain, wherein the other said inputs is coupled to said output transistor drain, and wherein said output is coupled to said first and second transistor gates.

6. The circuit according to claim 5 wherein said first and second transistors comprise PMOS transistors.

7. The circuit according to claim 1 wherein said current controlled oscillator comprises:
   a S-R flip-flop having set and reset inputs and an output wherein said output is said current controlled oscillator output;
   a set comparator having two inputs and an output wherein one of said inputs is coupled to a voltage reference and wherein said output is coupled to said S-R flip-flop set input;
   a reset comparator having two inputs and an output wherein one of said inputs is coupled to said voltage reference and wherein said output is coupled to said S-R flip-flop reset input;
   a set current-to-voltage converter having input and output wherein said input is switchably coupled to said current controlled oscillator input and wherein said output is coupled to said set comparator; and
   a reset current-to-voltage converter having input and output wherein said input is switchably coupled to said current controlled oscillator input and wherein said output is coupled to said reset comparator.

8. The circuit according to claim 7 wherein said set and reset current-to-voltage converters comprise:
   a capacitor having first and second terminals;
   a first switch coupled between said current controlled oscillator input and said first capacitor terminal; and
   a second switch coupled between said second capacitor terminal and ground.

9. A current sense circuit comprising:
   an output transistor having gate, source, and drain, wherein said drain is coupled to a load, wherein said source is coupled to a power rail, and wherein said gate is coupled to a control voltage such that said output transistor conducts an output current;
   a sense transistor having gate, source, and drain, wherein said source is coupled to said power rail, wherein said gate is coupled to said control voltage, and wherein a sensing factor is equal to said output transistor size divided by said sense transistor size;
   a means of equalizing said sense transistor drain-to-source voltage and said output transistor drain-to-source voltage such that said sense transistor drain current is equal to said output current divided by said sensing factor; and
   a current controlled oscillator having input and output wherein said input is said sense transistor drain current and said output comprises a cyclical signal having a frequency proportional to said output current and wherein said means of equalizing comprises:
     a first transistor having gate, drain, and source, wherein said source is coupled to said sense transistor drain and wherein said drain is coupled to said output transistor drain;
     a second transistor having gate, drain, and source, wherein said source is coupled to said sense transistor drain and wherein said drain is coupled to said current controlled oscillator input; and
     an amplifier having two inputs and an output wherein one of said inputs is coupled to said sense transistor drain, wherein the other of said inputs is coupled to said output transistor drain, and wherein said output is coupled to said first and second transistor gates.

10. The circuit according to claim 9 wherein said output transistor and said sense transistor comprise NMOS transistors.

11. The circuit according to claim 9 wherein said sensing factor value is a range between about 1 and 10,000.

12. The circuit according to claim 9 wherein said sensing factor value is adjustable.

13. The circuit according to claim 9 wherein said first and second transistors comprise PMOS transistors.

14. The circuit according to claim 9 wherein said current controlled oscillator comprises:
   a S-R flip-flop having set and reset inputs and an output wherein said output is said current controlled oscillator output;
   a set comparator having two inputs and an output wherein one of said inputs is coupled to a voltage reference and wherein said output is coupled to said S-R flip-flop set input;
   a reset comparator having two inputs and an output wherein one of said inputs is coupled to said voltage reference and wherein said output is coupled to said S-R flip-flop reset input;
   a set current-to-voltage converter having input and output wherein said input is switchably coupled to said current controlled oscillator input and wherein said output is coupled to said set comparator; and
   a reset current-to-voltage converter having input and output wherein said input is switchably coupled to said current controlled oscillator input and wherein said output is coupled to said reset comparator.

15. The circuit according to claim 14 wherein said set and reset current-to-voltage converters comprise:
   a capacitor having first and second terminals;
   a first switch coupled between said current controlled oscillator input and said first capacitor terminal; and
   a second switch coupled between said second capacitor terminal and ground.

16. A current sense circuit comprising:
   an output transistor having gate, source, and drain, wherein said drain is coupled to a load, wherein said source is coupled to a power rail, and wherein said gate is coupled to a control voltage such that said output transistor conducts an output current;
   a sense transistor having gate, source, and drain, wherein said source is coupled to said power rail, wherein said gate is coupled to said control voltage, and wherein a sensing factor is equal to said output transistor size divided by said sense transistor size;
   a means of equalizing said sense transistor drain-to-source voltage and said output transistor drain-to-source voltage such that said sense transistor drain current is equal to said output current divided by said sensing factor; and
   a current controlled oscillator having input and output wherein said input is said sense transistor drain current and said output comprises a cyclical signal having a frequency proportional to said output current and wherein said current controlled oscillator comprises:
      a S-R flip-flop having set and reset inputs and an output wherein said output is said current controlled oscillator output;
      a set comparator having two inputs and an output wherein one of said inputs is coupled to a voltage reference and wherein said output is coupled to said S-R flip-flop set input;
      a reset comparator having two inputs and an output wherein one of said inputs is coupled to said voltage reference and wherein said output is coupled to said S-R flip-flop reset input;
      a set current-to-voltage converter having input and output wherein said input is switchably coupled to said current controlled oscillator input and wherein said output is coupled to said set comparator; and
      a reset current-to-voltage converter having input and output wherein said input is switchably coupled to said current controlled oscillator input and wherein said output is coupled to said reset comparator and
   wherein said means of equalizing comprises:
      a first transistor having gate, drain, and source, wherein said source is coupled to said sense transistor drain and wherein said drain is coupled to said output transistor drain;
      a second transistor having gate, drain, and source, wherein said source is coupled to said sense transistor drain and wherein said drain is coupled to said current controlled oscillator input; and
      an amplifier having two inputs and an output wherein one of said inputs is coupled to said sense transistor drain, wherein the other of said inputs is coupled to said output transistor drain, and wherein said output is coupled to said first and second transistor gates.

17. The circuit according to claim 16 wherein said output transistor and said sense transistor comprise NMOS transistors.

18. The circuit according to claim 16 wherein said sensing factor value is adjustable.

19. The circuit according to claim 16 wherein said first and second transistors comprise PMOS transistors.

20. The circuit according to claim 16 wherein said set and reset current-to-voltage converters comprise:
   a capacitor having first and second terminals;
   a first switch coupled between said current controlled oscillator input and said first capacitor terminal; and
   a second switch coupled between said second capacitor terminal and ground.

* * * * *

UNITED STATES PATENT AND TRADEMARK OFFICE
CERTIFICATE OF CORRECTION

PATENT NO. : 6,552,579 B1  
APPLICATION NO. : 10/126384  
DATED : April 22, 2003  
INVENTOR(S) : Horst Knoedgen Page 1 of 1

It is certified that error appears in the above-identified patent and that said Letters Patent is hereby corrected as shown below:

Title Page in the Foreign Application Priority Data (30), delete "02392001" and replace with -- 02392004 --.

Signed and Sealed this  
Twelfth Day of March, 2013

Teresa Stanek Rea  
*Acting Director of the United States Patent and Trademark Office*